United States Patent [19]

Abrant et al.

[11] Patent Number: 4,740,914

[45] Date of Patent: Apr. 26, 1988

[54] ADDRESS GENERATOR

[75] Inventors: Robert J. Abrant, Villa Park, Ill.;
Michael D. Martys, Pittsfield, Mass.;
George K. Tarleton, Itasca, Ill.

[73] Assignee: GTE Communication Systems
Corporation, Phoenix, Ariz.

[21] Appl. No.: 687,786

[22] Filed: Dec. 31, 1984

[51] Int. Cl.[4] .................... G06F 12/00; G06F 15/00
[52] U.S. Cl. ........................ 364/900; 371/19;
307/49; 364/770
[58] Field of Search ... 364/200 MS File, 900 MS File,
364/770; 377/49, 125, 126; 371/19

[56] References Cited

U.S. PATENT DOCUMENTS

| | | | |
|---|---|---|---|
| 3,895,357 | 7/1975 | Schwartz et al. | 364/200 |
| 4,016,543 | 4/1977 | Franks et al. | 364/200 |
| 4,138,732 | 2/1979 | Suzuki et al. | 364/900 |
| 4,176,394 | 11/1979 | Kaminski et al. | 364/200 |
| 4,354,229 | 10/1982 | Davis et al. | 364/200 |
| 4,570,161 | 2/1986 | Kummer et al. | 340/799 |
| 4,628,477 | 12/1986 | Burrows | 364/900 |
| 4,641,260 | 2/1987 | Fukukita et al. | 364/726 X |

Primary Examiner—Raulfe B. Zache
Assistant Examiner—Thomas C. Lee
Attorney, Agent, or Firm—Gregory G. Hendricks; Peter Xiarhos

[57] ABSTRACT

An address generator which provides addresses for machine storage and software retrieval of computer status information. A counter is used to generate address signals in a descending order until it is disabled by a computer during alarm conditions. Under such conditions the counter provides a bias address for referencing the most recent status word. A gating circuit gates computer generated address signals to an adder circuit during the alarm conditions. The adder circuit adds the computer generated address signals to the counter generated bias signal to provide address signals which reference physical storage locations in a memory.

7 Claims, 1 Drawing Sheet

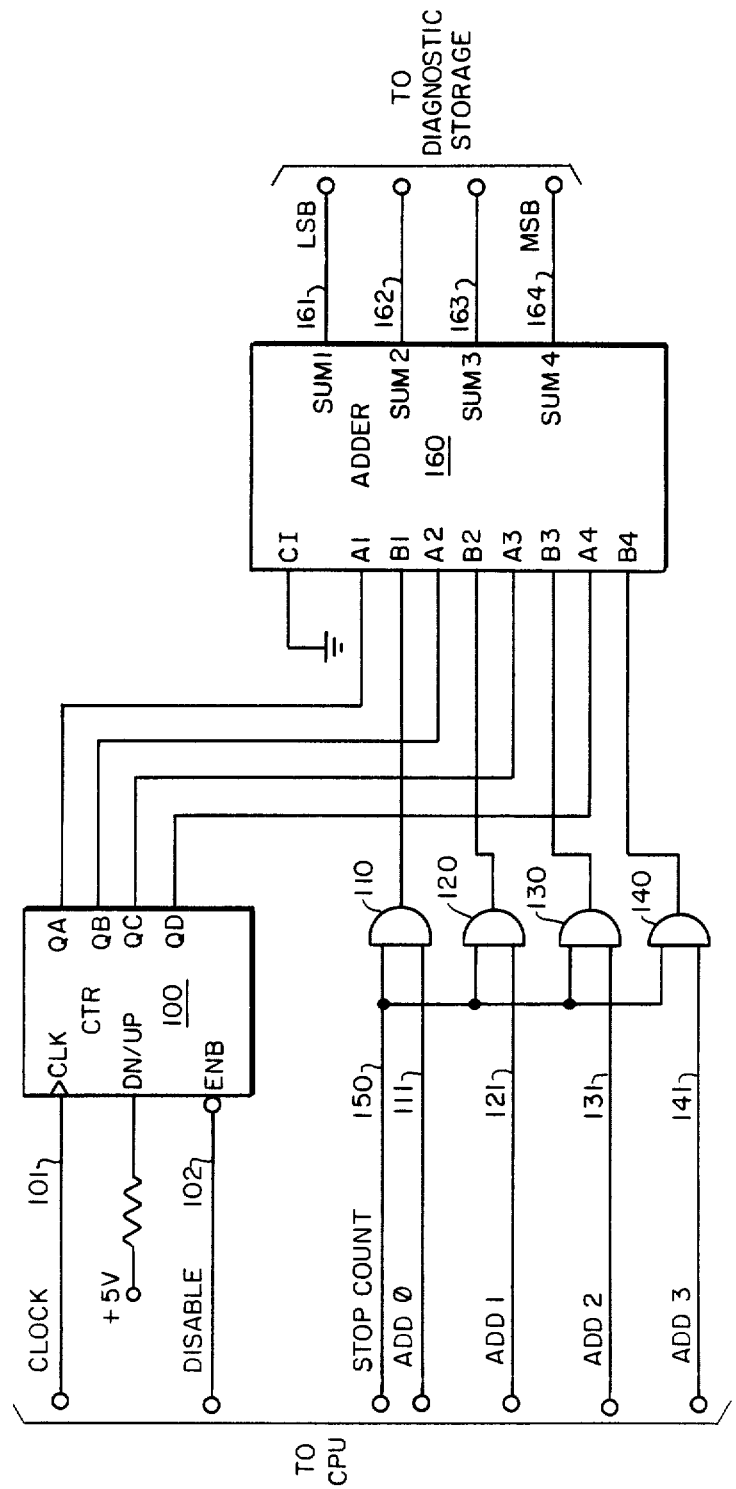

ADDRESS GENERATOR

FIELD OF THE INVENTION

The present invention relates to computers and more particularly to a circuit which generates addresses for storage and retrieval of computer status data.

BACKGROUND OF THE INVENTION

Computer systems become fault tolerant when they are able to diagnose failures and configure around them. In order to facilitate such diagnosis various computer data must be periodically stored such that when a fault does occur, the computer can retrieve the most recent relevant operating data to determine the nature of the fault.

Typically the computer machine cycle address bits, status signals and interrupt information are stored in memory during each machine cycle. Thus, in the invent of a fault, alarm condition, or a data or address error, the computer can retrieve the most recent status of information, e.g., the last 16 cycles of such data. The computer can then, determine the cause of the alarm, reconfigure around it, reconstruct the data present at the time of a fault, and then continue processing that data. Sixteen cycles of data are usually sufficient for determining the nature of a fault. Consequently, only 16 storage locations are required to store the status information since subsequent cycles of information are then written over the oldest data. Thus, the addresses for these 16 locations or words of data are repeated after every 16 cycles as the oldest of the 16 words is rewritten with the newest.

One approach for providing the addresses for such a diagnostic data storing system would be to provide a counter which supplies addresses of the data locations containing the stored data. Diagnostic software could then read back the addresses from the counter to determine the last used address. The software could then calculate the desired physical storage location in order to retrieve the desired data. However this approach requires a significant amount of hardware, complex software and a significant amount of real computer time.

SUMMARY OF THE INVENTION

In accordance with the present invention, on address generator is provided for use in a computer system that includes a clock circuit operated to provide periodic clock signals, and a computer operated to provide a disable signal, an enable signal, a stop count signal, a start count signal and a plurality of address signals.

The address generator includes counting means connected to the computer and the clock circuit and operated in response to the enable signal to count the clock pulses and to provide counter signals representative of the number of clock pulses counted. The counter signals have predetermined minimum and maximum values, and the counting means is further operated in response to detection of the disable signal to inhibit the counting of the clock pulses and to provide signals representative of the number of clock pulses counted immediately before detection of the disable signal;

An adder circuit is also included and it is connected to the counter. Gating means is also included and it is connected between the the computer and the adder circuit and is operated in response to the start count signal to provide a plurality of address signals of predetermined value. It is further operated in response to the stop count signal to gate the address signals to the adder circuit. The adder circuit is operated to add the counter signals to the address signals of predetermined value or to the gated address signals.

DESCRIPTION OF THE DRAWING

The single figure of the accompanying drawing is a schematic diagram of an address generator for storage and retrieval of diagnostic data in accordance with the present invention.

DESCRIPTION OF THE PREFERRED EMBODIMENT

Referring now to the accompanying drawing the address generator for storing and retrieving diagnostic data of the present invention is shown. Counter 100 has a clock (CLK) input connected to the CPU via clock lead 101, a down/up (DN/UP) input connected to a +5 volt source and an enable (ENB) input connected to the CPU via disable lead 102. This counter includes outputs QA, QB, QC and QD.

AND gates 110, 120, 130 and 140 have a first input connected to the CPU by a stop count lead 150 and they each have a second input connected to the CPU via address leads 111, 121, 131 and 141.

Adder 160 includes inputs A1, A2, A3 and A4 which are connected to the QA, QB, QC and QD outputs, respectively, of counter 100. This Adder also includes inputs B1, B2, B3 and B4 which are connected to AND gates 110, 120, 130 and 140, respectively. The carry input (CI) of this Adder is connected to ground. Adder 160 also includes outputs SUM 1, SUM 2, SUM 3 and SUM 4 which are connected to the diagnostic storage circuit which is typically a random access memory.

When a fault tolerant computer is operating normally its current status information is stored in a group of dedicated status words in memory. Once this storage is filled up the next subsequent status word is stored over the first status word and thus the newest data is stored on top of oldest data. In the present invention 16 status words in memory are used to store the most recent 16 machine cycle address bits, status signals, and interrupt information.

In the event of an alarm condition, the computer then retrieves these 16 most current status words and determines the nature of the alarm and reconfigures around it. When accessing the status words in memory, the computer accesses the most recent word first, in order to facilitate the quickest determination of the cause of an alarm condition. Since 16 memory locations are used to store the status information, 4 bit counter 100 is used to generate the addresses of those is status words in memory.

During normal operation the CPU applies a logic level 0 signal to disable lead 102. This logic level 0 signal appears at the ENB input of counter 100 and causes it to become enabled. Since the down/up (DN/UP) input of this counter is connected to a +5 volt source, a logic level 1 signal appears at this input causing it to count in the countdown mode of operation. Consequently, when clock pulses appear on clock lead 101, they are detected at the clock (CLK) input and counter 100 proceeds to count these clock pulses in the countdown mode. This counter then provides signals on the QA-QD outputs representative of counter values from 1111 (15) down through 00000. These signals then appear at the A1-A4 inputs of adder 160.

Also, during normal operation, the CPU applies a logic level 0 signal to stop count lead 150. Since this logic level 0 signal then appears at the first input of AND gates 110-140, these AND gates also provide logic level 0 signals at their outputs. These logic level 0 signals from AND gates 110-140 then appear at inputs B1-B4 of adder 160.

Adder 160 then adds the signals appearing at its B inputs to those appearing at its A inputs. Since a value of zero appears at its B1-B4 inputs, adder 160 adds zero to the value of the counter signals appearing at its A1-A4 inputs. Consequently, the same values appearing at the A1-A4 inputs of adder 160 also appear at its SUM 1-SUM 4 outputs. Therefore the output signals from counter 100 are applied to the diagnostic storage via leads 161-164. The most significant address bit appears on lead 164 and the least significant address bit appears on lead 161. The computer's current machine status, address, and interrupt information is then stored in memory defined by these address bits appearing on leads 161-164.

As counter 100 counts down address signals from this counter appear at leads 161-164 in decreasing value. When the counter reaches its lowest count it wraps around to the highest count and then repeats its count-down sequence. For example, initially logic level 1 signals may appear at each of leads 161-164. As Counter 100 counts down the next lower address appears on these leads. This address is represented by signals of logic level 1 on leads 164-162 and logic level 0 on lead 161. Consequently, the next sequence of machine status, address and interrupt information is stored in word 14 (1110). Subsequent status words would be addressed down to address zero (0000) which represents the 16th word in sequence starting from word 15 and ending at word zero. The 17th word to be stored is then written over the information stored in word 15. Thus 16 words of storage are used to store the 16 most current words of computer address, status and interrupt information.

During an alarm condition the CPU disables address counter 100 by applying a logic level 1 signal to disable lead 102. This address counter then freezes the address signals appearing at its QA and QD outputs. However, these signals remain applied to the A1-A4 inputs of the adder 160. Under such an alarm condition the CPU also applies a logic level 1 signal to stop count lead 150. This logic level 1 signal then appears at the first input of AND gates 110-140 enabling them gate the address signals appearing on leads 111-141 to inputs B1-B4 of adder 160.

The CPU then retrieves the status information by applying address signals ADD-0 to ADD-3 to leads 111-141, respectively. These 4 bit address signals represent 16 dedicated locations of memory storage used to store the most current 16 words of status information. In order to facilitate diagnosis, the CPU retrieves the most current of these 16 words first and the least current is retrieved last.

However, a fault condition may occur at any time within the sequence of addresses generated by counter 100. Therefore, it is unlikely that address zero in the memory will be the address that is being referenced by address counter 100 when a fault occurs. But, in accordance with the present invention the CPU merely references memory location zero by applying logic level 0 ADD0-ADD3 address signals to address leads 111-141 when it initiates retrieval of the status information. Adder 160 then converts the address signals provided by the CPU to the address signals required to reference the physical locations in memory with the most recent status information.

In order to retrieve the next most current word, the CPU applies a logic level 0 ADD1-ADD3 signals to leads 121-141 and a logic level 1 ADD0 signal to lead 111. These three logic level 0 signals and one logic level 1 signal are then applied to the B4-B3 and B1 inputs, respectively, of adder 160. Consequently, a value of one is added to the address signal that had been frozen by counter 100 and therefore adder 160 provides address signals that are incremented by one.

Thus, when the CPU retrieves the second most current word of status information it provides an address equal to one (0001). Adder 160 then adds this address value of one to the address signals it receives from counter 100 and generates a memory address that is one higher than the address of the word that was referenced when the fault occurred. This word is in fact the second most recent status word since counter 100 had been operating in a count down mode and thus the address signals it provided immediately before being disabled were in fact one higher than those that it provided when it was disabled.

Thus the CPU is able to reference the status words stored in memory in the sequence of the most current word first, by providing address signals which start with a value of 0 and are successively incremented by one. Such an address referencing arrangement does in fact retrieve the status words in the sequence of the most current word first since counter 100 provides address bits in a descending sequence. Thus the CPU is able to reference the status information in the proper sequence by using predetermined addresses without regard to where the most current information is actually stored in the memory storage locations.

It will be obvious to those skilled in the art that numerous modifications to the present invention can be made without departing from the spirit from the invention which shall be limited by the scope of the claims appended hereto.

What is claimed is:

1. An address generator for use in a computer system that includes a clock circuit operated to provide periodic clock signals, and a computer operated to provide a disable signal, an enable signal, a stop count signal, a start count signal and a plurality of address signals, said address generator comprising:

counting means connected to said computer and said clock circuit and operated in response to said enable signal to count said clock pulses and to provide counter signals representative of the number of clock pulses counted, said counter signals having predetermined minimum and maximum values, said counting means being further operated in response to detection of said disable signal to inhibit the counting of said clock pulses and to provide signals representative of the number of clock pulses counted immediately before detection of said disable signal;

an adder circuit connected to said counting means; and gating means connected between said computer and said adder circuit and operated in response to said start count signal to provide a plurality of address signals of predetermined value, and further operated in response to said stop count signal to gate said address signals from said computer to said adder circuit;

said adder circuit being operated to add said counter signals to said address signals of predetermined value or to said gated address signals.

2. An address generator as claimed in claim 1, wherein said gating means comprises a plurality of AND gates, each operated in response to said start count and stop count signals to provide said address signals of predetermined value and to gate an associated on of said address signals, respectively.

3. An address generator as claimed in claim 2, wherein said gating means comprises four AND gates.

4. An address generator as claimed in claim 1, wherein said counting means comprises a four bit counter.

5. An address generator as claimed in claim 1, wherein said adder circuit comprises a four bit adder.

6. An address generator as claimed in claim 1, wherein said counter is a down counter and said computer sequentially provides address signals of increasing value.

7. An address generator as claimed in claim 1, wherein said counter is an up counter and said computer sequentially provides address signals of decreasing value.

* * * * *